(12) United States Patent
Karnezos et al.

(10) Patent No.: US 7,253,511 B2
(45) Date of Patent: Aug. 7, 2007

(54) SEMICONDUCTOR MULTIPACKAGE MODULE INCLUDING DIE AND INVERTED LAND GRID ARRAY PACKAGE STACKED OVER BALL GRID ARRAY PACKAGE

(75) Inventors: Marcos Karnezos, Palo Alto, CA (US); Flynn Carson, Redwood City, CA (US); Youngcheol Kim, Young in-si (KR)

(73) Assignee: ChipPAC, Inc., Fremont, CA (US)

( * ) Notice: Subject to any disclaimer, the term of this patent is extended or adjusted under 35 U.S.C. 154(b) by 102 days.

(21) Appl. No.: 11/022,375

(22) Filed: Dec. 23, 2004

(65) Prior Publication Data

US 2006/0012018 A1    Jan. 19, 2006

Related U.S. Application Data

(60) Provisional application No. 60/587,428, filed on Jul. 13, 2004.

(51) Int. Cl.
H01L 23/02 (2006.01)
H01L 21/00 (2006.01)
H05K 5/00 (2006.01)

(52) U.S. Cl. .................. 257/686; 257/782; 257/784; 361/758; 361/790; 438/109

(58) Field of Classification Search ............... None
See application file for complete search history.

(56) References Cited

U.S. PATENT DOCUMENTS

| | | |
|---|---|---|
| 5,222,014 A | 6/1993 | Lin |
| 5,229,960 A | 7/1993 | De Givry |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |
| 5,744,863 A | 4/1998 | Culnane et al. |
| 5,898,219 A | 4/1999 | Barrow |
| 5,899,705 A | 5/1999 | Akram |
| 5,903,049 A | 5/1999 | Mori |
| 5,977,640 A | 11/1999 | Bertin et al. |
| 5,982,633 A | 11/1999 | Jeansonne |
| 5,994,166 A | 11/1999 | Akram et al. |
| 6,025,648 A | 2/2000 | Takahashi et al. |
| 6,034,875 A | 3/2000 | Heim et al. |
| 6,075,289 A | 6/2000 | Distefano |
| 6,118,176 A | 9/2000 | Tao et al. |
| 6,133,626 A | 10/2000 | Hawke et al. |
| 6,157,080 A | 12/2000 | Tamaki et al. |
| 6,201,266 B1 | 3/2001 | Ohuchi et al. |
| 6,201,302 B1 | 3/2001 | Tzu |
| 6,238,949 B1 | 5/2001 | Nguyen et al. |
| 6,265,766 B1 | 7/2001 | Moden |
| 6,274,930 B1 | 8/2001 | Vaiyapuri et al. |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,376,904 B1 | 4/2002 | Haba et al. |
| 6,388,313 B1 | 5/2002 | Lee et al. |
| 6,400,007 B1 | 6/2002 | Wu et al. |
| 6,407,456 B1 | 6/2002 | Ball |
| 6,413,798 B2 | 7/2002 | Asada |
| 6,414,381 B1 | 7/2002 | Takeda |
| 6,424,050 B1 | 7/2002 | Komiyama |
| 6,441,496 B1 | 8/2002 | Chen et al. |
| 6,445,064 B1 | 9/2002 | Ishii et al. |
| 6,462,421 B1 | 10/2002 | Hsu et al. |
| 6,472,732 B1 | 10/2002 | Terui |
| 6,472,741 B1 | 10/2002 | Chen et al. |
| 6,489,676 B2 | 12/2002 | Taniguchi et al. |
| 6,492,726 B1 | 12/2002 | Quek et al. |
| 6,501,165 B1 | 12/2002 | Farnworth |
| 6,512,303 B2 | 1/2003 | Moden |
| 6,538,319 B2 | 3/2003 | Terui |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,570,249 B1 | 5/2003 | Liao et al. |
| 6,583,503 B2 | 6/2003 | Akram et al. |
| 6,590,281 B2 | 7/2003 | Wu et al. |

| | | | |
|---|---|---|---|
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,611,063 B1 | 8/2003 | Ichinose et al. | |
| 6,621,169 B2 | 9/2003 | Kikuma et al. | |
| 6,621,172 B2 | 9/2003 | Nakayama et al. | |
| 6,649,448 B2 | 11/2003 | Tomihara | |
| 6,650,019 B2 | 11/2003 | Glenn et al. | |
| 6,667,556 B2 | 12/2003 | Moden | |
| 6,690,089 B2 | 2/2004 | Uchida | |
| 6,700,178 B2 | 3/2004 | Chen et al. | |
| 6,706,557 B2 | 3/2004 | Koopmans | |
| 6,716,676 B2 | 4/2004 | Chen et al. | |
| 6,734,539 B2 | 5/2004 | Degani et al. | |
| 6,734,552 B2 | 5/2004 | Combs et al. | |
| 6,737,750 B1 | 5/2004 | Hoffman et al. | |
| 6,746,894 B2 | 6/2004 | Fee et al. | |
| 6,747,361 B2 | 6/2004 | Ichinose | |
| 6,762,488 B2 | 7/2004 | Maeda et al. | |
| 6,777,799 B2 | 8/2004 | Kikuma et al. | |
| 6,777,819 B2 | 8/2004 | Huang | |
| 6,787,915 B2 | 9/2004 | Uchida et al. | |
| 6,787,916 B2 | 9/2004 | Halahan | |
| 6,794,749 B2 | 9/2004 | Akram | |
| 6,815,289 B2 * | 11/2004 | Hirano et al. | 438/255 |
| 6,818,980 B1 | 11/2004 | Pedron, Jr. | |
| 6,828,665 B2 | 12/2004 | Pu et al. | |
| 6,835,598 B2 | 12/2004 | Baek et al. | |
| 6,838,761 B2 | 1/2005 | Karnezos | |
| 6,847,105 B2 * | 1/2005 | Koopmans | 257/686 |
| 6,864,566 B2 | 3/2005 | Choi, III | |
| 6,882,057 B2 | 4/2005 | Hsu | |
| 6,890,798 B2 | 5/2005 | McMahon | |
| 6,900,528 B2 | 5/2005 | Mess et al. | |
| 6,906,415 B2 | 6/2005 | Jiang et al. | |
| 6,906,416 B2 | 6/2005 | Karnezos | |
| 6,930,378 B1 | 8/2005 | St. Amand et al. | |
| 6,930,396 B2 | 8/2005 | Kurita et al. | |
| 6,933,598 B2 | 8/2005 | Karnezos | |
| 6,951,982 B2 | 10/2005 | Chye et al. | |
| 6,972,481 B2 | 12/2005 | Karnezos | |
| 7,034,387 B2 | 4/2006 | Karnezos | |
| 7,045,887 B2 | 5/2006 | Karnezos | |
| 7,049,691 B2 | 5/2006 | Karnezos | |
| 7,053,476 B2 | 5/2006 | Karnezos | |
| 7,053,477 B2 | 5/2006 | Karnezos | |
| 7,057,269 B2 | 6/2006 | Karnezos | |
| 7,061,088 B2 | 6/2006 | Karnezos | |
| 7,064,426 B2 | 6/2006 | Karnezos | |
| 7,071,568 B1 * | 7/2006 | St. Amand et al. | 257/777 |
| 7,081,678 B2 | 7/2006 | Liu | |
| 7,101,731 B2 | 9/2006 | Karnezos | |
| 7,129,578 B2 * | 10/2006 | Togawa | 257/730 |
| 2002/0096755 A1 | 7/2002 | Fukui et al. | |
| 2002/0130404 A1 | 9/2002 | Ushijima et al. | |
| 2003/0113952 A1 | 6/2003 | Sambasivam et al. | |
| 2003/0153134 A1 | 8/2003 | Kawata et al. | |
| 2004/0016939 A1 | 1/2004 | Akiba et al. | |
| 2004/0061213 A1 | 4/2004 | Karnezos | |
| 2004/0212096 A1 * | 10/2004 | Wang | 257/777 |
| 2006/0043556 A1 * | 3/2006 | Su et al. | 257/686 |
| 2006/0091563 A1 * | 5/2006 | Arai et al. | 257/778 |
| 2006/0138631 A1 | 6/2006 | Tao et al. | |

FOREIGN PATENT DOCUMENTS

| | | | |
|---|---|---|---|
| JP | 05152505 A | | 6/1993 |
| JP | 2001223326 A | | 8/2001 |
| JP | 2004031563 A | * | 1/2004 |
| KR | 20010688614 A | | 7/2001 |
| KR | 2004085348 A | | 10/2004 |

* cited by examiner

*Primary Examiner*—Alonzo Chambliss
(74) *Attorney, Agent, or Firm*—Bill Kennedy; Haynes Beffel & Wolfeld

(57) ABSTRACT

A multipackage module has multiple die of various types and having various functions and, in some embodiments, the module includes a digital processor, an analog device, and memory. A first die, having a comparatively large footprint, is mounted onto first die attach region on a surface of a first package substrate. A second die, having a significantly smaller footprint, is mounted upon the surface of the first die, on a second die attach region toward one edge of the first die. The first die is electrically connected by wire bonds to conductive traces in the die-attach side of the substrate. The second die is electrically connected by wire bonds to the first package substrate, and may additionally be electrically connected by wire bonds to the first die. In some embodiments a spacer is mounted upon the first die, on a spacer attach region of the surface of the first die that is not within the die attach region, and which may be generally near a margin of the first die. A land grid array (LGA) package is inverted and mounted upon the spacer, with one margin of the LGA package near the edge of the spacer, so that much of the LGA package overhangs the second die. In other embodiments an additional spacer is mounted upon the first die, on a second spacer attach region that is not within the die attach region and not within the first spacer attach region, and the inverted LGA package is mounted upon both spacers. In still other embodiments a first spacer having a thickness approximating the thickness of the second die is mounted in a spacer attach region upon the first die; additional spacers are mounted upon both the first spacer and the second die, and the inverted LGA package is mounted upon the additional spacers. The LGA package is electrically connected to the first package substrate by wire bonds between bond sites on the LGA package and bond sites on the BGA package.

44 Claims, 6 Drawing Sheets

SEMICONDUCTOR MULTIPACKAGE MODULE INCLUDING DIE AND INVERTED LAND GRID ARRAY PACKAGE STACKED OVER BALL GRID ARRAY PACKAGE

CROSS-REFERENCE TO RELATED APPLICATIONS

This application claims the benefit of U.S. Provisional Application No. 60/587,428, filed 13 Jul. 2003, titled "Semiconductor multipackage module including die and inverted land grid array package stacked over ball grid array package", which is hereby incorporated herein by reference.

BACKGROUND

This invention relates to semiconductor device packaging and, particularly, to multipackage modules including die having various functions in the module.

In some practical applications, it can be desirable to combine several different types of electronic integrated circuit devices in a single package. Particularly for mobile communications devices, for example, it may be desirable to include in a single package a digital processor, an analog device, and a memory device. It is possible to stack one die over another in a stacked die package, although the interconnections of the several die can be complex.

A further challenge for packages having a variety of die types is raised by the fact that not all die are "good", and just one "bad" die in a stacked die package results in a failed package and wasted "good" die.

SUMMARY

According to the invention, multiple die of various types and having various functions are contained in a package, and in some embodiments the package includes a digital processor, an analog device, and memory. A first die, having a comparatively large footprint, is mounted onto a surface of a first package substrate. A second die, having a significantly smaller footprint, is mounted upon the surface of the first die, on a second die attach region toward one edge of the first die. The first die is electrically connected by wire bonds to conductive traces in the die-attach side of the substrate. The second die is electrically connected by wire bonds to the first package substrate, and may additionally be electrically connected by wire bonds to the first die. A spacer is mounted upon the first die, on a spacer attach region of the surface of the first die that is not within the die attach region, and which may be generally near a margin of the first die. A land grid array (LGA) package is inverted and mounted upon the spacer, with one margin of the LGA package near the edge of the spacer, so that much of the LGA package overhangs the second die. The LGA package is electrically connected to the first package substrate by wire bonds between bond sites on the LGA package and bond sites on the BGA package. The BGA package substrate may be provided with two rows of bond pads, at least along one margin, one row to provide for wire bonds from the BGA die and the other row to provide for wire binds from the inverted LGA package.

In such embodiments the spacer is offset from the center of the first die over which it is mounted. And in such embodiments the spacer is offset from the center of the LGA package that is mounted over it.

The spacer is sufficiently thick to hold the LGA package away from the underlying first and second die and away from contact with the wire bond loops connecting the first and second die to the first substrate or connecting the first and second die. That is, the combined thickness of the spacer and the adhesives, if any, used to affix the spacer to the first die on one side and the inverted LGA package on the other side, must be sufficiently great to allow clearance of the wire bonds, plus a tolerance to allow for limited tilt of the off-center LGA package during processing.

In one general aspect the invention features a first package, including a first package die mounted on a first package substrate, the active surface of the first package die facing away from the first package substrate and the first package die being electrically interconnected by wire bonds to conductive traces in the first package substrate, the active surface of the first package die comprising a second die attach region; and a spacer mounted on a spacer attach region of the active surface of the first package die, wherein the die attach region is outside the spacer attach region. The first package according to this aspect, having a spacer mounted on the first package die, is useful in constructing multipackage modules that have a second die mounted on the second die attach region beside the spacer, and having one or more additional devices, such as an inverted package, mounted on the spacer and overhanging the second die.

In another general aspect the invention features a first package, including a first package die mounted on a first package substrate, the active surface of the first package die facing away from the first package substrate and the first package die being electrically interconnected by wire bonds to conductive traces in the first package substrate, the active surface of the first package die comprising a spacer attach region; and a second die mounted on a die attach region of the active surface of the first package die, wherein the die attach region is outside the spacer attach region. The second die is electrically interconnected by wire bonds to conductive traces on the first package substrate; or the second die is electrically interconnected by wire bonds to pads on the first package die; or the second die is electrically interconnected by wire bonds both to pads on the first package die and to conductive traces on the first package substrate. The first package according to this aspect, having a second die mounted on the first package die, is useful in constructing multipackage modules that have a spacer mounted on the spacer attach region and one or more additional devices, such as an inverted package, mounted on a spacer and overhanging the second die.

In some embodiments the second die attach region is situated away from the center of the active side of the first package die, and it may be situated near an edge of the surface of the first package die, and it may be situated near a corner of the surface of the first package die. In some embodiments the spacer attach region is situated near an edge of the first package die.

In another general aspect the invention features a multipackage module including a first package, including a first package die mounted on a first package substrate, the active surface of the first package die facing away from the first package substrate and the first package die being electrically interconnected by wire bonds to conductive traces in the first package substrate, the active surface of the first package die having a second die attach region and a spacer attach region; and including a second die mounted on the second die attach region and a spacer mounted on the spacer attach region; and including an inverted land grid array package mounted on the spacer and overhanging at least a portion of the second die. The second die is electrically interconnected by wire bonds to conductive traces on the first package substrate; or the second die is electrically interconnected by wire bonds to pads on the first package die; or the second die is electrically interconnected by wire bonds both to pads on the first package die and to conductive traces on the first package substrate. The inverted land grid array package is electrically interconnected to the first package substrate by wire bonds between bond sites in conductive traces on the upward-facing surface of the land grid array package and conductive traces on the first package substrate. On some embodiments a molding is formed to cover and protect the land grid array package and wires associated with it, the second die and wires associated with it, and the exposed portions of the first package and the spacer.

In another general aspect the invention features a land grid array package, including a LGA substrate having a dielectric layer and at least one conductive layer and having sides and first and second surfaces, the LGA substrate having wire bond sites exposed along an edge of the second surface of the LGA substrate for electrical interconnection to an additional package, the land grid array package having a first LGA die mounted on a die attach region of the first surface of the LGA substrate and electrically interconnected by wire bonds between die pads along an edge of the first LGA die and sites exposed along an edge of the first surface of the LGA substrate. In some embodiments both an edge of the first surface and an edge of the second surface are at one side of the LGA substrate. In some embodiments the land grid array package further includes a second LGA die, mounted on a second LGA die attach region of the first LGA die and electrically interconnected by wire bonds between die pads along an edge of the second LGA die and sites exposed along an edge of the first surface of the LGA substrate; the second LGA die is situated such that an edge of the second LGA die having die pads is generally parallel to and offset from an edge of the first LGA die having die pads, so that the edge of the second LGA die does not contact the die pads on the first LGA die. In some embodiments the die and wire bonds are covered by a molding having a surface that constitutes a surface of the land grid array package.

The LGA package according to this aspect of the invention can be particularly useful in constructing multipackage modules having the land grid array package inverted and mounted over a spacer mounted over a first package, and electrically interconnected to the first package ("z-interconnection") by wire bonds, where the spacer has a smaller footprint than the land grid array package. In such a module a significant part of the land grid array package extends beyond the spacer, and is not supported. The inverted land grid array package according to the invention can be situated over the spacer such that the spacer supports the part of the land grid array package near an edge of the package having the z-interconnect pads, providing improved stability of the assembly particularly during the z-interconnect wire-bonding procedure.

In some embodiments the second die attach region is situated away from the center of the active side of the first package die, and it may be situated near an edge of the surface of the first package die, and it may be situated near a corner of the surface of the first package die. In some embodiments the spacer attach region is situated near an edge of the first package die.

In some embodiments of the invention the first die is a digital processor; and the first die together with the first die substrate constitute a ball grid array (BGA) package. In some embodiments the second die is an analog die. In some embodiments the LGA package is a memory package.

The LGA package may have a single die, or two or more stacked die. The LGA package die may have bond pads (fingers) along only one margin, and in such embodiments the LGA package substrate has wire bond sites along the corresponding margin. Where the LGA package includes two or more die, the die may be stacked with their respective bond pad margins toward the same edge of the package, and offset to leave space for the wire bonds between the respective die and the nearby margin of the LGA package substrate. The LGA may have ball pads in addition to bond fingers (but has no solder balls). The ball pads can provide for testing of the LGA package prior to assembly in the module.

The spacer may be a solid piece, of a material such as glass or silicon, and it may be for example a "dummy" die; and it is affixed to the first die and to the LGA package using an adhesive. Or, a "filled" spacer adhesive can be employed to provide adhesion and spacing between the lower package die and the upper package. Such an adhesive spacer can provide for an even closer spacing between the upper package and the lower die, approaching the loop height of the wire bonds connecting the lower package die to the lower package substrate.

In other embodiments an additional spacer is mounted upon the stacked second die, to further minimize tilt of the LGA package during processing, and to help reduce warpage in the LGA package.

In some such embodiments a silicon spacer ("dummy" die) is provided, having the same thickness as the stacked second die. Such a spacer would not be thick enough to provide clearance for the wire loops. Accordingly, in these embodiments a filled spacer adhesive is provided over both the spacer and the stacked second die. One suitable type of filled spacer adhesive is an adhesive filled with polymer spheres. The filled adhesive spacer is selected to have polymer spheres (filler) of a diameter sufficient to provide the required additional elevation of the LGA package above the stacked second die and BGA substrate to clear the wire bond loops; that is, the polymer spacers are selected to have a diameter no less than the loop height of the wire bonds on the second die, plus some tolerance.

Such embodiments have a further advantage, in providing for more straightforward process molding the module; particularly, in embodiments not having the spacer between the second die and the LGA package, there is between the second die and the LGA package a thin volume having a relatively large area. If it is too thin, this volume is not readily filled with molding compound, and this provides a limitation on the extent to which the package can be made thinner.

The invention can provide for a lower profile multipackage module. The use of this invention is in the field of semiconductor packaging and particularly in the field of Multi Chip Packages (MCP) or System in Package (SiP) or Multi Package Modules (MPM).

The invention can be useful in building computers, telecommunications devices, consumer devices, particularly portable devices, and industrial electronics applications.

The invention provides various die in a single thin package or module having a footprint approximating that of a BGA package; particularly, a digital signal processor and an analog processor and a memory package can be included in the module.

Standard packages can be Used for the BGA package and for the LGA package, and cost can thereby be reduced.

Using an LGA package inverted and stacked on an off-center spacer over the BGA package die provides for, among other features: wire binding of the BGA die to the BGA substrate; wire bonding of the LGA package to the BGA substrate; stacking the second die upon the BGA die beneath the overhang of the LGA substrate.

The LGA can be fully tested prior to assembly, providing for increased module manufacture yield.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS. Also, certain terms such as "upper" and "lower", and "over" and "under", and "upon" and "beneath", may be used with reference to the FIGs. To suggest relative positions of features and for illustration only.

Figure 1:
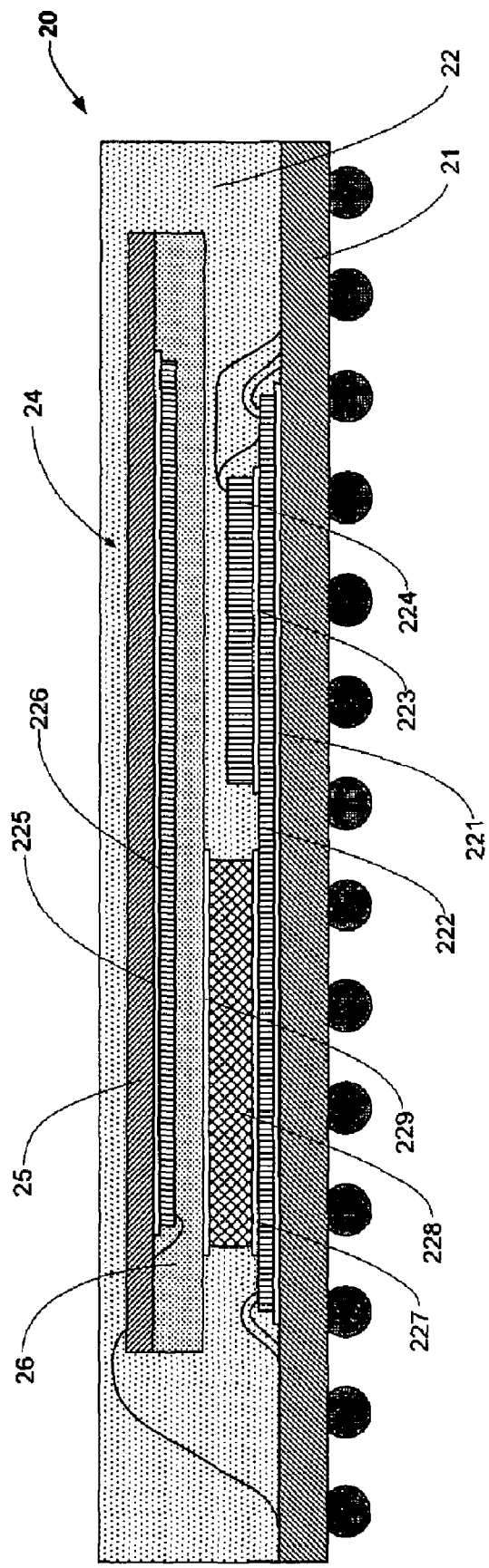
FIG. 1 is a diagrammatic sketch in a sectional view showing a multipackage module according to an embodiment of the invention.

Turning now to FIG. 1, a multipackage module according to an embodiment of the invention is shown generally at 20. The multipackage module includes a ball grid array (BGA) package including a die 222 affixed onto, and electrically connected by wire bonds to, a substrate 21. The BGA package die 222 is affixed onto the substrate 21 using an adhesive 221. The BGA package die is stacked over the BGA package die 222, and is affixed using an adhesive 223 onto a second die attach region on the BGA package die 222. In this embodiment the second die 224 is electrically connected by wire bonds to the BGA package die 222 as well as to the BGA substrate 21. A spacer 228 is also situated over the BGA package die 222, and is affixed using an adhesive 227 onto a spacer attach region on BGA package die 222. A land grid array (LGA) package, indicated generally at 24, is inverted and stacked over the BGA package die 222 and the second die 223, and is affixed using an adhesive 229 onto the exposed surface of spacer 228. The inverted LGA package 24 includes a die 226 affixed onto, and electrically connected by wire bonds to, a substrate 25. An encapsulant or molding 26 encloses the LGA package die 226 and the associated wire bonds and the wire bond sites on the LGA substrate 25. The LGA package is provided with wire bond pads on the LGA substrate surface opposite the LGA die attach surface (that is, on the LGA substrate surface not covered by the LGA molding or encapsulant), and the inverted stacked LGA package is electrically connected to the BGA package substrate using wire bonds running from the wire bond pads on the LGA package substrate to wire bond sites on the BGA package substrate. A module encapsulant or molding 22 encloses the LGA package 24, the spacer 228, the second die 224, the BGA die 222, and the various interconnecting wire bonds to complete the package 20.

In some embodiments the BGA package die is a digital processor, and the LGA package is a memory package, and the second die is an analog die. In embodiments such as shown in FIG. 1 the spacer attach region and the second die attach region are side-by-side on the BGA die surface, and the spacer is, accordingly, off-center—that is, the spacer is toward the side of the BGA die surface. Also in embodiments such as shown in FIG. 1 the LGA package is significantly larger than the spacer. Moreover the die in the upper package has wire bond interconnects along fewer than all the die margins and, in particular, the wire bond interconnects of the BGA package die are situated along only one margin of the die and the LGA pads on the opposite surface of the LGA substrate are situated along only one margin of the LGA substrate. In such embodiments the inverted LGA package is arranged so that a significant part of the LGA package overhangs the second die, in a cantilever fashion, and the LGA package is arranged so that the margin having the wire bonds pads is near an edge of the spacer. Accordingly the wire bonding of the LGA package to the BGA substrate involves a much less extensively cantilevered part of the LGA package.

The spacer 228 is made thick enough so that, together with the thicknesses of the adhesives 227, 229, sufficient space is provided to accommodate the loop height of the wire bonds between the second die and the first die, and between the second die and the BGA substrate. The spacer 228 may be a solid piece, which may be glass, for example, or silicon, such as for example a "dummy" die. The adhesives 227 and 228 are selected so that downward tilt of the cantilevered part of the LGA package is minimized. While some tilt may be tolerated, the cantilevered part of the LGA package must not tilt enough to contact the wire bonds beneath it. Accordingly, the spacer may be made thicker, to provide additional clearance over the wire bond loops from the BGA die and from the second die. And, tilting the LGA package results in raising the margin of the LGA package that carries the wire bonds between the LGA package and the BGA package substrate, and if this happens to too great a degree the wire bond loops may be exposed at the surface of the muddle encapsulation or molding. The adhesives 227 and 229 may be, for example, an epoxy such as "Loctite QMI536", for example. This adhesive is sufficiently sticky when uncured to hold the off-center LGA package in place; then a curing step follows, and a plasma clean prior to wire bonding. Where the spacer is a solid piece, as shown in the FIGs., one or both of the adhesives may be provided as an adhesive film. Spacer constructs having film adhesives, and methods for constructing device stacks using them, are described for example in U.S. patent application Ser. Nos. 10/959,713, 10/976,601, 10/959,659.

Or, the spacer 228 may be a filled adhesive such as an adhesive having polymer spheres dimensioned to provide sufficient space between the BGA surface and the LGA package surface. Where the spacer is a spacer adhesive, any of various adhesive spacer configurations may be employed, for example as described in U.S. patent application Ser. Nos. 10/966,572, 10/966,574, 10/969,116, 10/969,303. Each of the aforementioned patent applications is incorporated by reference herein. A B-stageable epoxy may be preferred as the adhesive component of a filled adhesive spacer in such embodiments. Where the spacer is a filled adhesive spacer, adhesives 227 and 229 are not necessary.

The BGA die can be affixed to the BGA substrate, and the LGA die can be affixed to the LGA substrate, and the second die can be attached to the BGA die, using any of a variety of standard die attach epoxies such as, for example, "Ablebond 2025D"; and the die attach adhesive may be an adhesive film.

Any of various substrate types may be used, including for example: a laminate with 2-6 metal layers, or a build up substrate with 4-8 metal layers, or a ceramic multilayer substrate; or—for a very thin package—a flexible polyimide tape with 1-2 metal layers. Typically the metal layer or layers having pads for interconnection or by wires or solder balls, or for testing (for example in embodiments where the inverted LGA is provided with an area array of pads for contact during a test of the package), is overlain by a solder mask or other dielectric layer patterned to have openings over the pads. On one surface of the BGA substrate (the "lower" surface in the FIGs), openings in the solder mask are provided to expose pads for solder ball interconnection with circuitry in the device or apparatus in which the module is used such as, for example, a motherboard (not shown in the FIGs.). On the opposite surface of the BGA substrate (onto which the first die is attached; the "upper" surface in the FIGs.), one or more rows of bond pads are provided for wire bond interconnection between the BGA substrate and one or more of the first die and the stacked second die; and one or more rows of bond pads are provided for wire bond interconnection between the BGA substrate and the inverted LGA package substrate. On one surface of the inverted LGA substrate (the "downward-facing" surface in the FIGs.), one or more rows of bond pads are provided for interconnection between the LGA package die and the LGA package substrate. On the opposite surface of the LGA package substrate, one or more rows of bond pads are provided for interconnection between the LGA package substrate and the BGA package substrate; and optionally an area array of pads may additionally be provided, suitable for testing the LGA package prior to assembly in the module.

The BGA package and the LGA package can selected from certain be standard packages; the LGA (memory) package is provided with bond fingers (along one margin only, in the examples shown in the FIGs.), and may optionally additionally include ball pads.

Optionally, and in some applications preferably, the ball attach pads on the upward-facing side of the inverted top package substrate may be employed to facilitate testing of the LGA using a conventional test socket. Such testing of the LGA can be carried out prior to attaching the top LGA package into the bottom package, to ensure that only top LGAs testing as "good" are stacked over the bottom BGA packages (which may also be tested and identified as "good"). Or, testing of the LGA can be carried out following inversion of the LGA and attachment as a top package, but prior to formation of the overall module molding, or prior to z-interconnect wire-bonding. Testing, facilitated according to the constructs of the invention, at any of various stages in manufacture, can significantly reduce the likelihood of further processing of components that do not meet specifications.

The wire bonds may be formed by any wire bonding technique, well known in the art, such as is described, for example, in U.S. Pat. No. 5,226,582, which is hereby incorporated by reference herein. They may be made by forward bonding or by reverse bonding. That is, they can be made by forming a bead or bump on the upper surface of a pad on a patterned metal layer of the stacked second die or the stacked LGA package substrate, and then drawing the wire downward toward and fusing it onto, a pad on a patterned metal layer of the BGA substrate; or they can be made in the reverse direction, that is, by forming a bead or bump on the surface of a pad on the patterned metal layer of the BGA substrate, and then drawing the wire upward toward and fusing it onto a pad on the patterned metal layer of the LGA substrate or on the stacked second die. As will be appreciated, selection of a wire bonding strategy will be determined according to the geometric arrangements of the margins of the stacked substrates and of the bonding surfaces on them. Wire bonds may be forward-bonded or reverse-bonded.

Figure 2A:
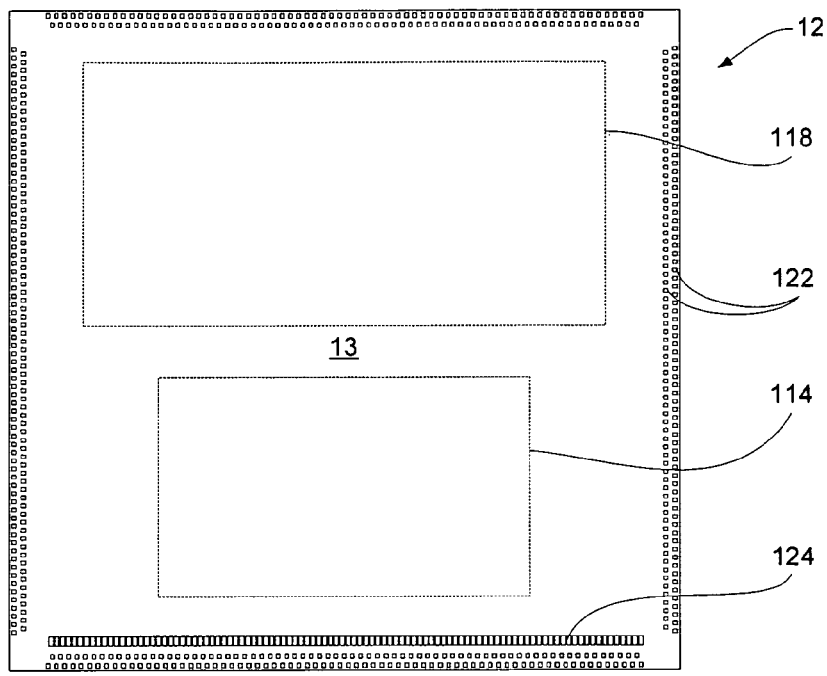
FIG. 2A is a diagrammatic sketch in a plan view showing a die in a BGA package, as in a multipackage module similar to that shown in FIG. 1, and indicating the footprints of a die and a spacer stacked over the BGA die, according to an embodiment of the invention.
Figure 2B:
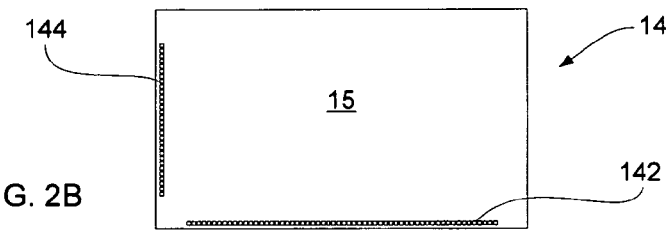
FIG. 2B is a diagrammatic sketch in a plan view showing a die, as stacked over a BGA package die in a multipackage module similar to that shown in FIG. 1, according to an embodiment of the invention.
Figure 2C:
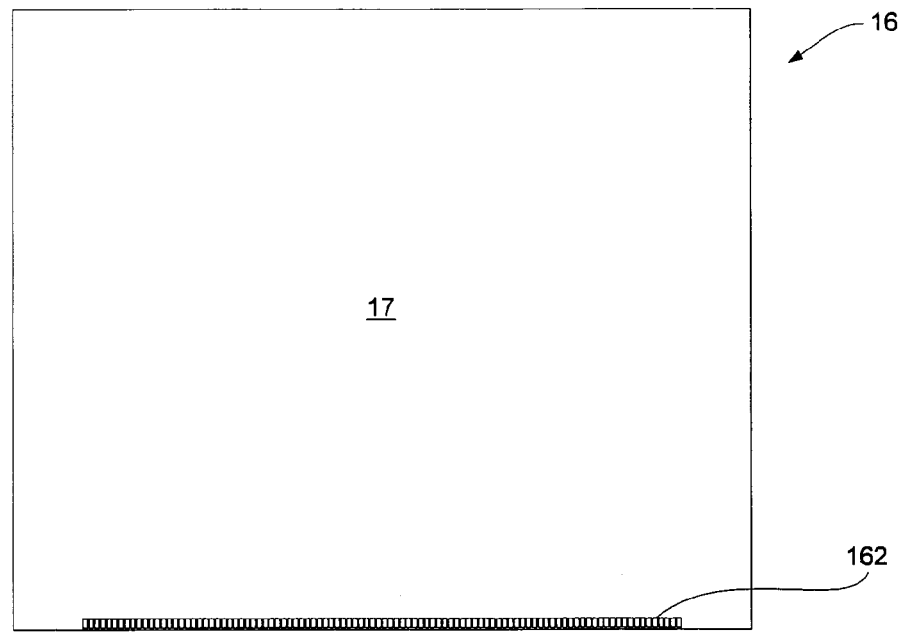
FIG. 2C is a diagrammatic sketch in a plan view showing a LGA package, as inverted and stacked over a die stacked over a BGA package die in a multipackage module similar to that shown in FIG. 1, according to an embodiment of the invention.

FIGS. 2A, 2B, and 2C are diagrammatic sketches in a plan view, illustrating certain of the components of a module similar to the one shown in FIG. 1. FIG. 2A shows generally at 12 a plan view of the active side 19 of a first die. The footprint of the spacer (that is, the spacer attach region) is indicated by the broken line 118, and the footprint of the second die (that is, the second die attach region) is indicated by the broken line 114. In this example, the first die is a die having staggered rows of bond pads 122 on all four sides, for wire bonding the first die to the first package substrate; and a row of bond pads 124 on one side for wire bonding of the second stacked die to the first die. FIG. 2B shows generally at 14 a plan view of the active side 15 of the second die. In this example the second die has a row of bond pads 142 along one margin, for connection of the second die to the first die; and a row of bond pads 144 along an adjacent margin, for connection of the second die directly to the BGA substrate (not shown in this FIG.). FIG. 2C shows generally at 16 a plan view of the upward-facing side 17 of the inverted LGA package. In this example the LGA package has bond fingers 162 along one edge, for wire bond connection directly to the BGA substrate (not shown in this FIG.). It can be advantageous where the LGA package is a memory package to arrange the bond fingers along one edge of the LGA package, and to assemble the module so that the edge of the LGA package having the bond pads (and the wire bonds to the BGA substrate) is situated away from the second die, because this can minimize signal noise between the analog die and the LGA memory.

The dimensions of the second die attach region (second die footprint) will be determined according to the dimensions of the second die. Typically the second die has a much smaller footprint than the first die. The second die may be an analog device, for example, and may have a footprint as small as 1 mm by 1 mm. The position of the second die may depend upon whether the second die is electrically interconnected to the first die by wire bonds to pads on the active side of the first die and, if so, on the number and positions of the pads. The second die may be situated close to the margin of the first die, to minimize the lengths of the wire bonds to the first package substrate; but because the second die is mounted onto the active side of the first die, it must not be placed so close to die pads on the margin of the first die, or the pads my be contaminated by the adhesive employed to affix the second die onto the first die. Generally, where a liquid epoxy is employed to affix the second die, the edge of the second die may be as close as about 125 um to the die pads on the first die, without severe risk of contamination; where a film adhesive is used, the edge of the second die may be as close as about 100 um to the pads on the first die, without severe risk of contamination. Similar considerations apply to positioning the spacer near the edge of the first die. The dimensions of the spacer attach region depend in part on the dimensions of the second die footprint. The spacer region must not overlap the die attach region, and where the spacer is to be positioned near the second die, sufficient space must be provided between them to permit free flow of molding compound during a later module molding process. The spacer itself should have a sufficiently large footprint to provide adequate support for the second package, particularly during the wire bonding procedure for interconnection of the second package with the first package. Some stability may be provided by selection of a suitable adhesive. A so-called "snap cure" epoxy can be rapidly partly cured (hardened) within a few seconds after application, and may be preferred for mounting the second package onto the spacer. As noted below, more than one spacer may be provided on the spacer attach region of the first die, for additional stability; or, an additional spacer may be provided on the second die. The spacer may have a footprint as small as about 1 mm by 1 mm, for example, where the spacer is a solid material such as a "dummy" die; but a spacer having such a small dimension is unlikely to provide sufficient support for the second package, unless additional support is provided.

Figure 6:
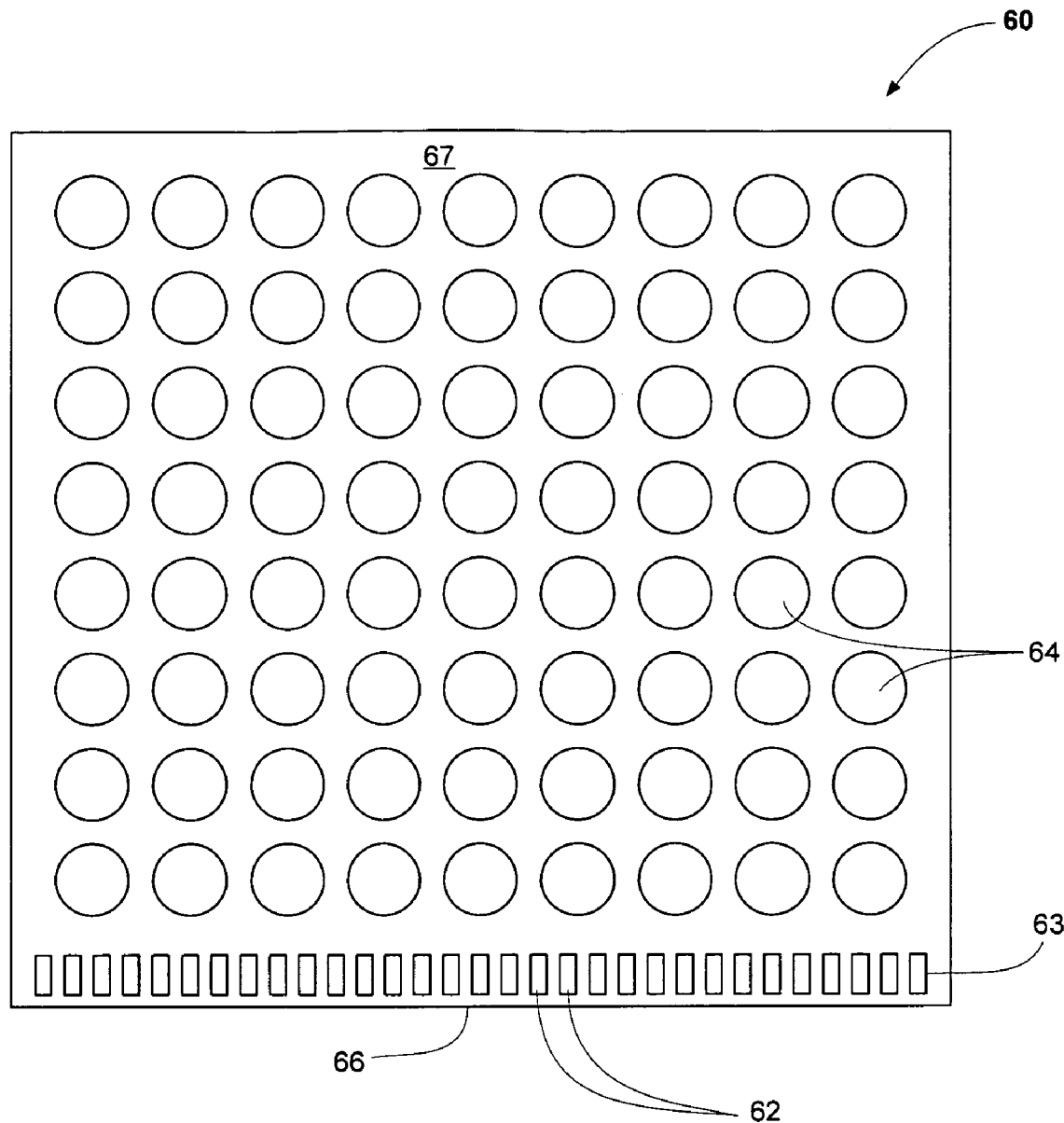
FIG. 6 is a diagrammatic sketch in a plan view showing a LGA package, as inverted and stacked over a die stacked over a BGA package die in a multipackage module similar to that shown in FIG. 1, according to an embodiment of the invention.

FIG. 6 shows a plan view of the upward-facing side 67 of an exemplary alternative embodiment of an LGA package according to an alternative embodiment of the invention, generally at 60. In this example the LGA package has a row 63 of bond fingers, e.g. 62, along one edge 66, for wire bond interconnection directly to the BGA substrate (not shown in this FIG.) and additionally has an area array of pads, e.g. 64, for testing.

Figure 3:
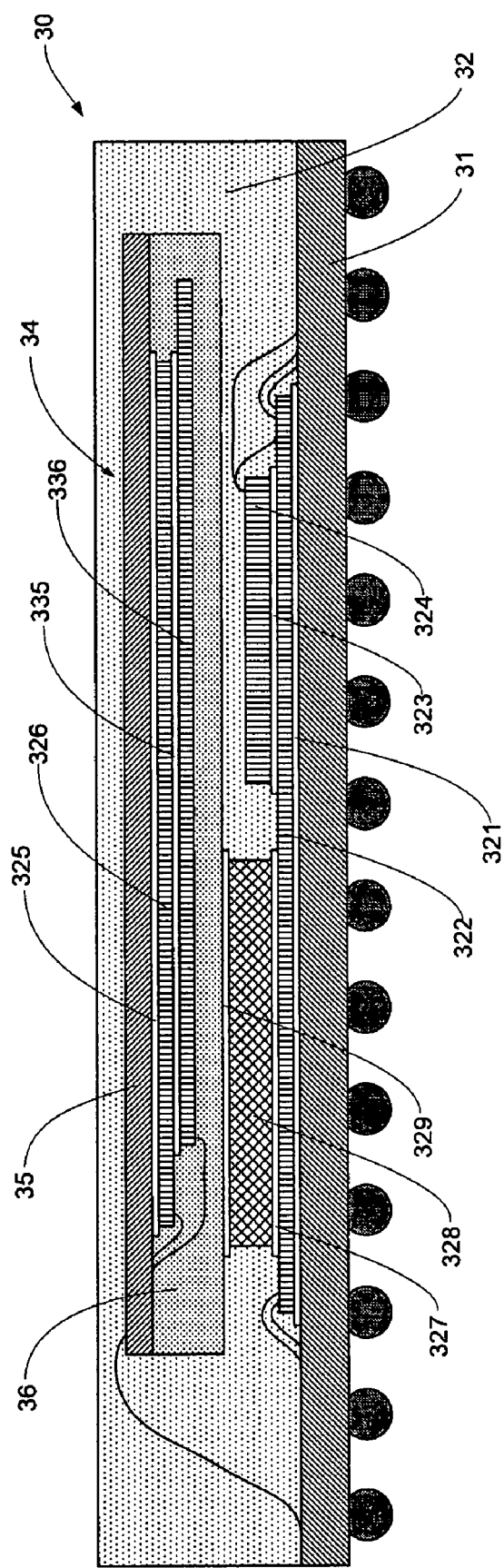
FIG. 3 is a diagrammatic sketch in a sectional view showing a multipackage module according to an embodiment of the invention.

FIG. 3 is a diagrammatic view as in FIG. 1, showing generally at 30 an alternative embodiment of a multipackage module according to the invention. This example is similar to that shown in FIG. 1, except that here the LGA package is a stacked die package. The multipackage module includes a ball grid array (BGA) package including a die 322 affixed onto, and electrically connected by wire bonds to, a substrate 31. The BGA package die 322 is affixed onto the substrate 31 using an adhesive 321. A second die 324 is stacked over the BGA package die 322, and is affixed using an adhesive 323 onto a second die attach region on the BGA package die 322. In this embodiment the second die 324 is electrically connected by wire bonds to the BGA package die 322 as well as to the BGA substrate 31. A spacer 328 is also situated over the BGA package die 322, and is affixed using an adhesive 327 onto a spacer attach region on BGA package die 322. A land grid array (LGA) package, indicated generally at 34, is inverted and stacked over the BGA package die 322 and the second die 323, and is affixed using an adhesive 329 onto the exposed surface of spacer 328. The inverted LGA package 34 includes a first die 326 affixed onto, and electrically connected by wire bonds to, a substrate 35; and a second die 336 affixed onto the first die 326, and also electrically connected by wire bonds to the substrate 35. In this example the first and second die 326, 336 have wire bond pads along just one die edge. The die are stacked in an offset manner with their respective bond pads situated toward the same margin of the LGA package. The first die 326 is affixed to the LGA package substrate 35 using an adhesive 325, and the second die 336 is affixed to the active surface of the first die using an adhesive 335. An encapsulant or molding 36 encloses the LGA package die 325, 326 and the associated wire bonds and the wire bond sites on the LGA substrate 35. The LGA package is provided with wire bond pads on the LGA substrate surface opposite the LGA die attach surface (that is, on the LGA substrate surface not covered by the LGA molding or encapsulant), and the inverted stacked LGA package is electrically connected to the BGA package substrate using wire bonds running from the wire bond pads on the LGA package substrate to wire bond sites on the BGA package substrate. A module encapsulant or molding 32 encloses the LGA package 34, the spacer 328, the second die 324, the BGA die 322, and the various interconnecting wire bonds to complete the package 30.

In some embodiments the BGA package die is a digital processor, and the LGA package is a memory package, and the second die is an analog die. In embodiments such as shown in FIG. 3 the spacer attach region and the second die attach region are side-by-side on the BGA die surface, and the spacer is, accordingly, off-center—that is, the spacer is toward the side of the BGA die surface. Also in embodiments such as shown in FIG. 3 the LGA package is significantly larger than the spacer. Moreover the die in the upper package has wire bond interconnects along fewer than all the die margins and, in particular, the wire bond interconnects of the BGA package die are situated along only one margin of the die and the LGA pads on the opposite surface of the LGA substrate are situated along only one margin of the LGA substrate. In such embodiments the inverted LGA package is arranged so that a significant part of the LGA package overhangs the second die, in a cantilever fashion, and the LGA package is arranged so that the margin having the wire bonds pads is near an edge of the spacer. Accordingly the wire bonding of the LGA package to the BGA substrate involves a much less extensively cantilevered part of the LGA package.

As in the example of FIG. 1, the spacer 328 is made thick enough so that, together with the thicknesses of the adhesives 327, 329, sufficient space is provided to accommodate the loop height of the wire bonds between the second die and the first die, and between the second die and the BGA substrate. The spacer 328 may be a solid piece, which may be glass, for example, or silicon, such as for example a "dummy" die. The adhesives 327 and 328 are selected so that downward tilt of the cantilevered part of the LGA package is minimized. While some tilt may be tolerated, the cantilevered part of the LGA package must not tilt enough to contact the wire bonds beneath it. Accordingly, the spacer may be made thicker, to provide additional clearance over the wire bond loops from the BGA die and from the second die. And, tilting the LGA package results in raising the margin of the LGA package that carries the wire bonds between the LGA package and the BGA package substrate, and if this happens to too great a degree the wire bond loops may be exposed at the surface of the muddle encapsulation or molding. The adhesives 327 and 329 may be, for example, an epoxy such as "Loctite QMI536", for example. This adhesive is sufficiently sticky when uncured to hold the off-center LGA package in place; then a curing step follows, and a plasma clean prior to wire bonding.

Or, as in the example of FIG. 1, the spacer 328 may be a filled adhesive such as an adhesive having polymer spheres dimensioned to provide sufficient space between the BGA surface and the LGA package surface. Where the spacer is a filled adhesive adhesives 327 and 329 are not necessary. A B-stageable epoxy may be preferred as the adhesive component of a filled adhesive spacer in such embodiments.

Adhesives may be selected for the example of FIG. 3 as for the example of FIG. 1. The BGA die can be affixed to the BGA substrate, and the LGA die can be affixed to the LGA substrate, and the second die can be attached to the BGA die, using any of a variety of standard die attach epoxies such as, for example, "Ablebond 2025D"; and the die attach adhesive may be an adhesive film.

Any of various substrate types may be used, including for example: a laminate with 2-6 metal layers, or a build up substrate with 4-8 metal layers, or a ceramic multilayer substrate; or—for a very thin package—a flexible polyimide tape with 1-2 metal layers.

The BGA package and the LGA package can selected from certain be standard packages; the LGA (memory) package is provided with bond fingers (along one margin only, in the examples shown in the FIGs.), and may optionally additionally include ball pads.

Optionally, and in some applications preferably, the ball attach pads on the upward-facing side of the inverted top package substrate may be employed to facilitate testing of the LGA using a conventional test socket. Such testing of the LGA can be carried out prior to attaching the top LGA package into the bottom package, to ensure that only top LGAs testing as "good" are stacked over the bottom BGA packages (which may also be tested and identified as "good"). Or, testing of the LGA can be carried out following inversion of the LGA and attachment as a top package, but prior to formation of the overall module molding, or prior to z-interconnect wire-bonding. Testing, facilitated according to the constructs of the invention, at any of various stages in manufacture, can significantly reduce the likelihood of further processing of components that do not meet specifications.

As in the example of FIG. 1, the wire bonds in the example of FIG. 3 may be formed by any wire bonding technique, well known in the art. Wire bonds may be forward-bonded or reverse-bonded.

Figure 4A:
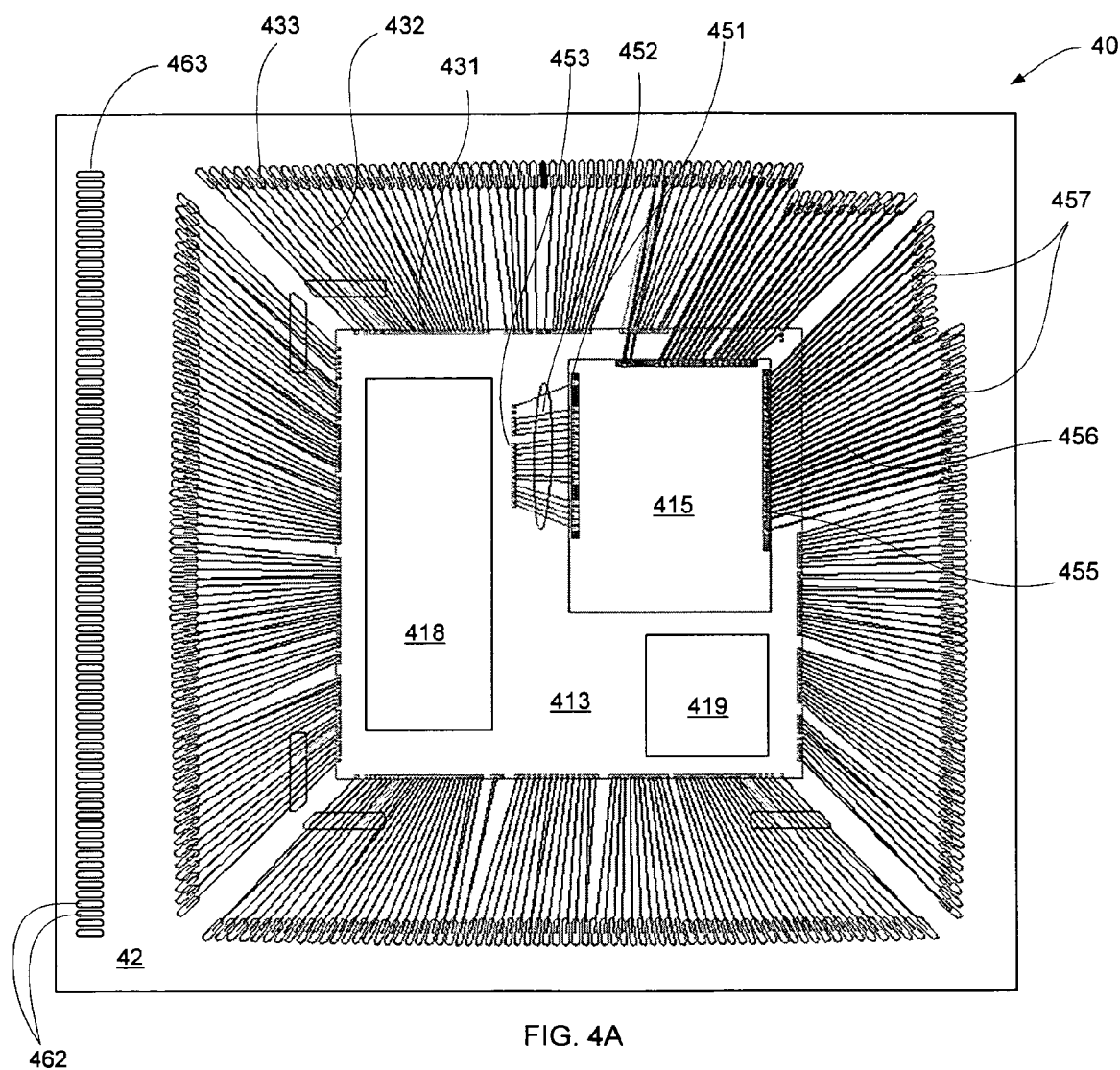
FIG. 4A is a diagrammatic sketch in a plan view showing a BGA package and a die and two spacers stacked over the BGA package die, and showing wire bond interconnections between the stacked die and the BGA package die, and between the BGA die and the BGA substrate, and between the stacked die and the substrate, according to an embodiment of the invention having two spacers mounted onto the BGA substrate.

A further embodiment of the invention is illustrated in a plan view in FIG. 4A. In this example, two spacers 418, 419 are shown mounted onto the surface 413 of the first die alongside the stacked second die 415. Here, the second die attach region is toward a corner of the surface 413 of the first die, leaving a L-shaped area exposed. Two spacers are mounted onto the first die in this L-shaped area, providing for improved reduction of tilt of the LGA (the LGA is not shown in the FIG. In this example, bond pads 431 on the first die are electrically connected by wire bonds 432 to bond sites 433 on the substrate 42, generally on the entire margin of the first die, except near the corner where the second die attach region is situated. Bond pads 451 along one margin of the second die are electrically connected by wire bonds 452 to bond sites 453 on the first die; and bond pads 455 on two other, adjacent, margins of the second die are electrically connected by wire bonds 456 to bond sites 457 on the substrate 42. The substrate 42 additionally has a row 463 of bond fingers, e.g. 462, along a substrate edge, for interconnection by wire bonds between the LGA package 40 and the BGA package substrate 42.

Figure 4B:
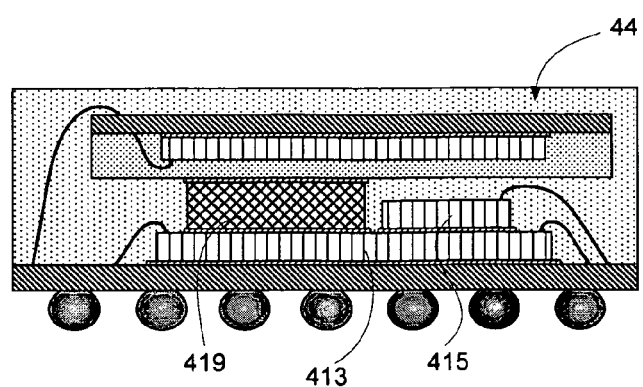
FIG. 4B is a diagrammatic sketch in a sectional view showing a multipackage module similar to that shown in FIG. 4A, according to an embodiment of the invention.

FIG. 4B shows an embodiment similar to that of FIG. 4A, in a sectional view. One of the spacers 419 is shown in this view mounted upon the surface of the first die 413 alongside second die 415. As in the example of FIG. 1, the inverted LGA package 44 is mounted off-center upon the spacer 419, so that a substantial part of the LGA package 44 overlies the second die 415. Here, however, further support for the LGA package 44 is provided by another spacer (not visible in this sectional view) which is mounted over the first die 415 in a spacer attach region not occupied by the second die 415 and the spacer 419. As in the example of FIG. 3, the LGA package 44 may be a stacked die package.

Figure 5A:
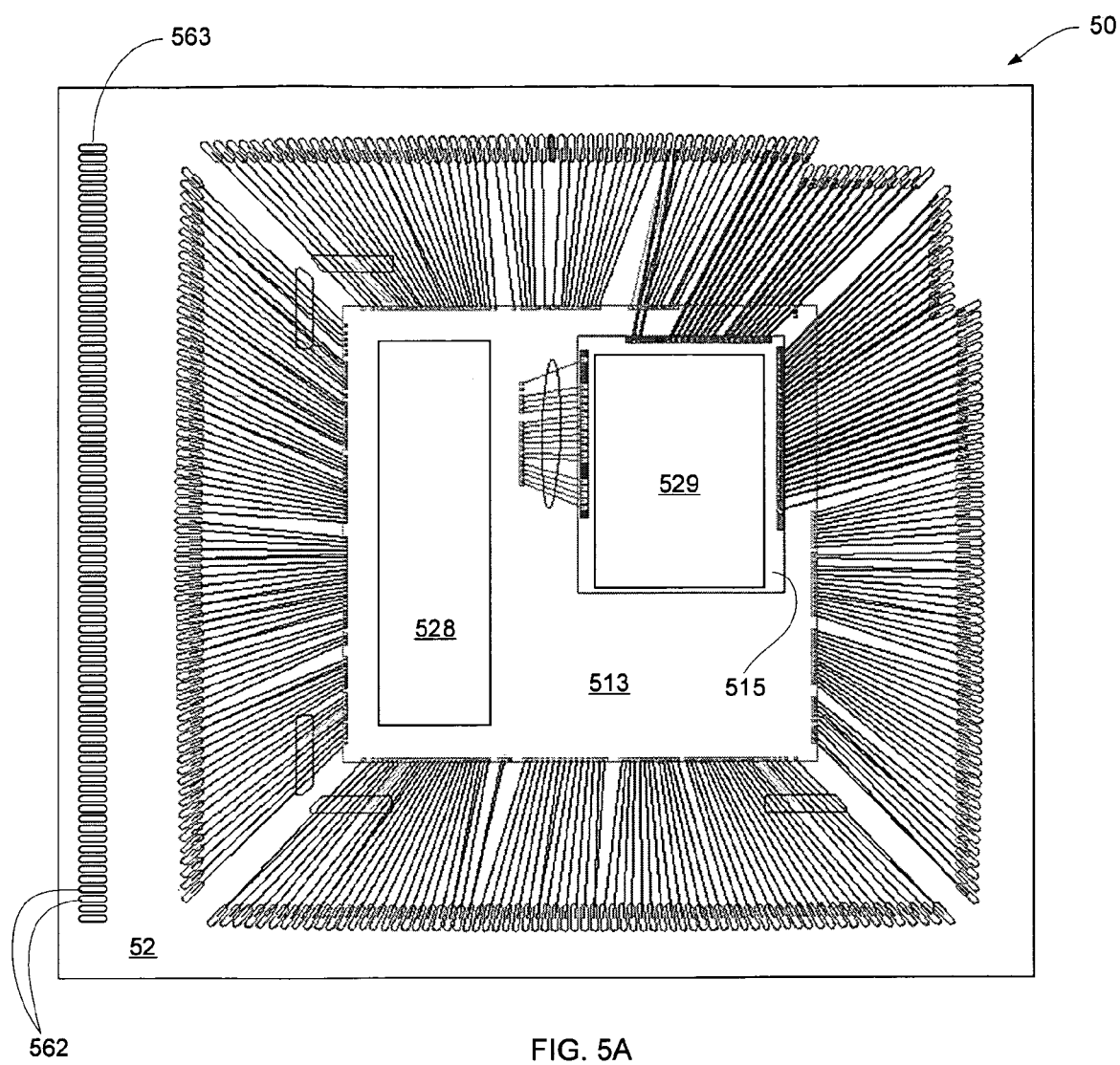
FIG. 5A is a diagrammatic sketch in a plan view showing a BGA package and a die and spacer stacked over the BGA package die and a spacer over the stacked die, and showing wire bond interconnections between the stacked die and the BGA package die, and between the BGA die and the BGA substrate, and between the stacked die and the substrate, according to an embodiment of the invention.
Figure 5B:
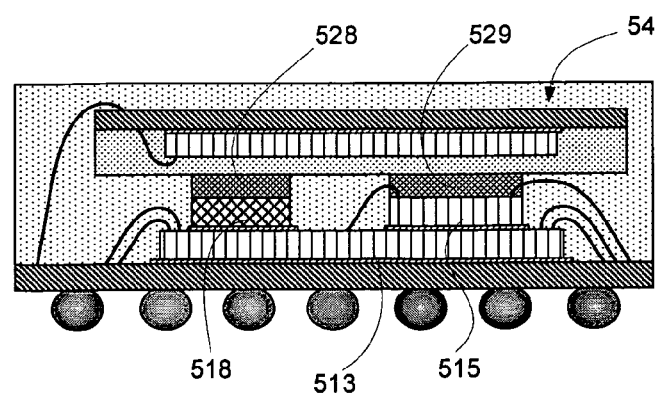
FIG. 5B is a diagrammatic sketch in a sectional view showing a multipackage module similar to that shown in FIG. 5A, according to an embodiment of the invention.

Another embodiment is shown in a plan view in FIG. 5A, and a similar embodiment is shown in a sectional view in FIG. 5B. In this example, a first spacer 518 is mounted onto the surface 513 of the first die alongside the stacked second die 515. The first spacer has a thickness approximately the same as the thickness of the second die 515. Additional spacers 528, 529 are provided upon the first spacer 518 and the second die 515. The additional spacers have approximately equal thickness, so their upper surfaces 528, 519 describe a substantially planar surface upon which the inverted LGA package 54 can be mounted. The thickness of the additional spacers is sufficiently great to provide adequate clearance for the wire bond loops beneath the inverted LGA. In the example shown here, as in FIG. 4A, the second die attach region is toward a corner of the surface 513 of the first die, leaving a L-shaped area exposed. The first spacer 518 is mounted onto the first die in one arm of this L-shaped area. The first spacer and the additional spacer mounted upon it, together with the second die and the additional spacer mounted upon it, provide a good support for the inverted LGA package, substantially reducing tilt of the LGA package.

In this example, as in the example of FIGS. 4A and 4B, bond pads on the first die 513 are electrically connected by wire bonds to bond sites on the substrate 52, generally on the entire margin of the first die, except near the corner where the second die attach region is situated. Bond pads along one margin of the second die 515 are electrically connected by wire bonds to bond sites on the first die; and bond pads on two other, adjacent, margins of the second die 515 are electrically connected by wire bonds to bond sites on the substrate 52. The substrate 52 additionally has a row 563 of bond fingers, e.g. 562, along a substrate edge, for interconnection by wire bonds between the LGA package 50 and the BGA package substrate 52.

FIG. 5B shows an embodiment similar to that of FIG. 5A, in a sectional view. A spacer 519 is shown in this view mounted upon the surface of the first die 513 alongside second die 515. Additional spacers 528, 529 are provided upon the first spacer 519 and the second die 529, to provide clearance for the wire bonds. The inverted LGA package 54 is mounted off-center upon the additional spacer 528, as in FIG. 1, but here the LGA package is additionally supported by the additional spacer 529 on the second die, so that part of the LGA package 54 that overlies the second die 515 is supported rather than cantilevered.

In addition to providing support for the part of the LGA that overlies the second die, the additional spacer over the second die fills the space between the second die and the LGA package, eliminating processing concerns during the molding process. Particularly, it is not necessary in these embodiments for mold compound to flow in the space between the second die and the LGA package, and so the vertical clearance between the second die and the LGA package can be specified according to the wire bond loop height (plus a tolerance), without regard for any requirement that the space be large enough for effective mold compound flow during molding.

Any of a variety of spacer types may be employed as additional spacers according to the invention. Particularly useful are any of various filled spacer adhesives, having filler particles, typically polymer spheres or spherules in an adhesive matrix. The thickness dimension is determined by the dimension of the filler particles (diameter of the polymer spheres, for example). Suitable spacers are discussed above with reference to FIG. 2, for example.

Other embodiments are contemplated within the scope of the invention. For instance, the arrangement of the second die and the spacer (or spacers) on the first die surface can be established according to the dimensions of the first and second die, and according to the arrangement of pads. The inverted LGA package in any embodiment can have a single die, or two or more stacked die, as may be required for the particular module function.

Various die can be used as the first die and the second die, and as the LGA package die, according to the invention. The arrangements of the various wire bond pads on the die and on the package substrates can be different according to the design of the various die.

A module according to the invention can be provided with a heat spreader. Preferably a heat spreader in embodiments according to this aspect of the invention is a generally planar heat-conducting piece, such as of metal, having a planar surface exposed to ambient at the upper surface of the module. The heat spreader may be mounted upon the upward-facing surface of the LGA package, and affixed there using an adhesive, which may be a heat-conductive adhesive, and which preferably is electrically non-conductive in embodiments where the upward-facing surface of the LGA package has exposed test pads. The package can be molded after the heat spreader has been mounted onto the assembly. Or, the heat spreader may be separated from the upward-facing surface of the LGA package. In such embodiments the heat spreader is dropped into the mold cavity, and the package assembly is placed over it, and the molding compound is then flowed into the cavity. Various heat spreaders for modules, and techniques for constructing them, are described for example in U.S. application Ser. No. 10/681,572, which is hereby incorporated by reference.

One or more additional die and/or additional packages may be stacked over the LGA package, mounted onto the upward-facing surface of the LGA package and affixed using an adhesive. Such additional packages or die may be interconnected to the LGA package by bumps or balls, particularly to the area array of pads (in embodiments where an additional die is a flip-chip die, or where an additional package is a BGA package) or by wire bonds (in embodiments where an additional die is mounted active-side upward, or where an additional package is inverted, for example). A spacer may be required between such an additional die or package, in embodiments where the additional device would otherwise interfere with wire bonds between the upward-facing surface of the LGA package and the BGA package substrate. That is, if an additional die has a sufficiently small footprint that it can be mounted over the LGA package in a position offset from any rows of wire bond sites, then a spacer may not be required.

Stacked multipackage modules according to the invention can be made very thin. Various of the thickness parameters of the various components can be adjusted, and compromises made, according to selected criteria of cost and performance, as well as manufacturablity.

Also, stacked multipackage modules according to the invention can have a small footprint; typically the lower limit for the footprint is determined by the BGA package size, which in turn is determined by the BGA die dimensions, with an allowance for circuitry and wire bond sites on the BGA substrate.

What is claimed is:

1. A semiconductor package, comprising
a first package die mounted on a first package substrate, the active surface of the first package die facing away from the first package substrate and the first package die being electrically interconnected by wire bonds to conductive traces in the first package substrate, the active surface of the first package die comprising a spacer attach region and a second die attach region;
a spacer mounted on the spacer attach region of the active surface of the first package die, wherein the second die attach region is outside the spacer attach region; and
a second package, mounted on the spacer and overhanging at least a portion of the second die attach region.

2. The package of claim 1, further comprising a second die mounted on the second die attach region beside the spacer.

3. The package of claim 1 wherein the second package is inverted land grid array package, and wherein the land grid array package is electrically interconnected to the first package by wire bonds between wire bond sites on the upward-facing surface of the second package and wire bond sites on the upward-facing surface of the first substrate.

4. The package of claim 1 wherein the spacer attach region is situated near an edge of the first package die.

5. The package of claim 1 wherein the spacer comprises a solid piece, affixed to the first die using an adhesive.

6. The package of claim 1 wherein the spacer comprises an adhesive spacer.

7. A semiconductor package, comprising
a first package die mounted on a first package substrate, the active surface of the first package die facing away from the first package substrate and the first package die being electrically interconnected by wire bonds to conductive traces in the first package substrate, the active surface of the first package die comprising a spacer attach region and a second die attach region;
a second die mounted on the die attach region of the active surface of the first package die, wherein the die attach region is outside the spacer attach region; and
a second package, mounted on the second die and overhanging at least a portion of the spacer attach region.

8. The package of claim 7, further comprising a spacer mounted on the spacer attach region beside the second die.

9. The package of claim 7 wherein the second die is electrically interconnected by wire bonds to conductive traces on the first package substrate.

10. The package of claim 7 wherein the second die is electrically interconnected by wire bonds to pads on the first package die.

11. The package of claim 9 wherein the second die is additionally electrically interconnected by wire bonds to pads on the first package die.

12. The package of claim 7 wherein the second die attach region is situated away from the center of the active side of the first package die.

13. The package of claim 7 wherein the second die attach region is situated near an edge of the active side of the first package die.

14. The package of claim 13 wherein the second die attach region is situated near a corner of the active side of the first package die.

15. A multipackage module comprising
a first package, the first package comprising a first package die mounted on a first package substrate, the active surface of the first package die facing away from the first package substrate and the first package die being electrically interconnected by wire bonds to conductive traces in the first package substrate, the active surface of the first package die having a second die attach region and a spacer attach region;
a second die mounted on the second die attach region and a spacer mounted on the spacer attach region; and
an inverted land grid array package mounted on the spacer and overhanging at least a portion of the second die.

16. The multipackage module of claim 15 wherein the second die is electrically interconnected by wire bonds to conductive traces on the first package substrate.

17. The multipackage module of claim 16 wherein the second die is additionally electrically interconnected by wire bonds to pads on the first package die.

18. The multipackage module of claim 15 wherein the second die is electrically interconnected by wire bonds to pads on the first package die.

19. The multipackage module of claim 15 wherein the inverted land grid array package is electrically interconnected to the first package substrate by wire bonds between bond sites in conductive traces on the upward-facing surface of the land grid array package and conductive traces on the first package substrate.

20. The multipackage module of claim 15, further comprising a molding over the land grid array package and wires associated therewith, the second die and wires associated therewith, and the exposed portions of the first package and the spacer.

21. The multipackage module of claim 15 wherein the first package is a ball grid array package.

22. The multipackage module of claim 15 wherein the first package die is a digital processor.

23. The multipackage module of claim 15 wherein the second die is an analog device.

24. The multipackage module of claim 15 wherein the land grid array package is a memory package.

25. A multipackage module comprising a first package comprising a first package die and first package substrate, and a LGA package comprising a first LGA package die mounted on a die attach region of a first surface of a LGA substrate, wherein a spacer is mounted over the first package die and the LGA package is inverted and mounted over the spacer, the spacer having a smaller footprint than the LGA package, and wherein the inverted LGA package is electrically interconnected to the first package by wire bonds between interconnect sites on the upward-facing surface of the LGA package and interconnect sites on the upward-facing surface of the first package substrate.

26. The multipackage module of claim 25, wherein the LGA package further comprises a second LGA package die, mounted on a die attach region of the first LGA die and electrically interconnected by wire bonds between die pads along an edge of the second LGA die and sites exposed along an edge of the first surface of the LGA substrate.

27. The multipackage module of claim 26 wherein the second LGA package die is situated such that an edge of the second land grid array package die having die pads is generally parallel to and offset from an edge of the first LGA die having die pads, so that the edge of the second LGA die does not contact the die pads on the first LGA die.

28. The land grid array package of claim 25 wherein the LGA package die and wire bonds are covered by a molding having a surface that constitutes a surface of the LGA package.

29. The multipackage module of claim 25 wherein a part of the LGA package extends beyond the spacer, and wherein the inverted LGA package is situated over the spacer such that the spacer supports a part of the LGA package near an edge of the package having interconnect sites.

30. The multipackage module of claim 25, further comprising a second package die mounted on a second die attach region of the active surface of the first package die.

31. The multipackage module of claim 30, wherein the second die attach region is situated away from the center of the active side of the first package die.

32. The multipackage module of claim 30 wherein the second die attach region is situated near an edge of the surface of the first package die.

33. The multipackage module of claim 30 wherein the second die attach region is situated near a corner of the surface of the first package die.

34. The multipackage module of claim 30 wherein the spacer is situated near an edge of the first package die.

35. The multipackage module of claim 30 wherein the first package die is a digital processor.

36. The multipackage module of claim 30 wherein the first package die and the first package substrate comprise a ball grid array package.

37. The multipackage module of claim 30 wherein the second package die comprises an analog device.

38. The multipackage module of claim 30, further comprising a second spacer mounted on the first package die.

39. The multipackage module of claim 30, further comprising an additional spacer mounted on the second die.

40. The multipackage module of claim 39, wherein the additional spacer comprises a solid piece, affixed to the second die using an adhesive.

41. The multipackage module of claim 40, wherein the additional spacer comprises an adhesive spacer.

42. The multipackage module of claim 25 wherein the LGA package comprises a memory package.

43. The multipackage module of claim 25 wherein the spacer comprises a solid piece, affixed to the first die and to the LGA package using an adhesive.

44. The multipackage module of claim 25 wherein the spacer comprises an adhesive spacer.

* * * * *